United States Patent
Soininen

(10) Patent No.: US 11,041,243 B2
(45) Date of Patent: Jun. 22, 2021

(54) COATING PRECURSOR NOZZLE AND A NOZZLE HEAD

(71) Applicant: BENEQ OY, Espoo (FI)

(72) Inventor: Pekka T. Soininen, Espoo (FI)

(73) Assignee: BENEQ OY, Espoo (FI)

( * ) Notice: Subject to any disclaimer, the term of this patent is extended or adjusted under 35 U.S.C. 154(b) by 352 days.

(21) Appl. No.: 15/780,358

(22) PCT Filed: Dec. 15, 2016

(86) PCT No.: PCT/FI2016/050874
§ 371 (c)(1),
(2) Date: May 31, 2018

(87) PCT Pub. No.: WO2017/103333
PCT Pub. Date: Jun. 22, 2017

(65) Prior Publication Data
US 2018/0347044 A1   Dec. 6, 2018

(30) Foreign Application Priority Data

Dec. 17, 2015   (FI) ..................... 20155962

(51) Int. Cl.
C23C 16/455   (2006.01)
C23C 16/44   (2006.01)
(52) U.S. Cl.
CPC .... *C23C 16/45574* (2013.01); *C23C 16/4408* (2013.01); *C23C 16/45551* (2013.01)
(58) Field of Classification Search
CPC .......... C23C 16/45574; C23C 16/4408; C23C 16/45551
See application file for complete search history.

(56) References Cited

U.S. PATENT DOCUMENTS

| | | | |
|---|---|---|---|
| 2008/0166880 A1* | 7/2008 | Levy | C23C 16/45525 438/758 |
| 2011/0023775 A1* | 2/2011 | Nunes | C23C 16/45582 118/58 |

(Continued)

FOREIGN PATENT DOCUMENTS

| CN | 102851648 A | 1/2013 |
|---|---|---|
| EP | 2159304 A1 | 3/2010 |

(Continued)

OTHER PUBLICATIONS

Search Report FI Patent Application No. 20155962, dated Apr. 27, 2016, in 1 page.

(Continued)

*Primary Examiner* — Jeffrie R Lund
(74) *Attorney, Agent, or Firm* — Robert P. Michal, Esq.; Carter, DeLuca & Farrell LLP

(57) ABSTRACT

The invention relates to coating precursor nozzle (15) for subjecting a surface of a substrate (5) to a coating precursor. The nozzle (15) having a nozzle output face (10*a*), first and second nozzle side edges (31, 32), and first and second nozzle end edges (33, 34). The coating precursor nozzle (15) comprising a precursor supply channel (16), a first discharge channel (17*a*), a first cross purge gas channel (18*a*), a second cross purge gas channel (18*b*), a first edge purge gas channel (19*a*) and at least one first auxiliary purge gas channel (20). The invention further relates to a nozzle head (1).

20 Claims, 3 Drawing Sheets

(56) References Cited

U.S. PATENT DOCUMENTS

| | | | |
|---|---|---|---|
| 2011/0076421 A1 | 3/2011 | Lee | |
| 2011/0097491 A1* | 4/2011 | Levy | C23C 16/54 427/248.1 |
| 2013/0001330 A1 | 1/2013 | Huang | |
| 2013/0149446 A1* | 6/2013 | Soininen | C23C 16/45551 427/248.1 |
| 2015/0004318 A1* | 1/2015 | Alasaarela | C23C 16/45574 427/255.28 |
| 2015/0368798 A1* | 12/2015 | Kwong | C23C 16/45578 118/729 |
| 2015/0368799 A1* | 12/2015 | Jiang | C23C 16/45574 427/255.28 |
| 2016/0168703 A1* | 6/2016 | Alasaarela | C23C 16/45563 427/255.28 |
| 2016/0226031 A1* | 8/2016 | Jang | C23C 16/54 |
| 2017/0159179 A1* | 6/2017 | Soininen | C23C 16/45544 |
| 2018/0347044 A1* | 12/2018 | Soininen | C23C 16/45574 |
| 2019/0186001 A1* | 6/2019 | Lee | C23C 16/4408 |
| 2019/0186010 A1* | 6/2019 | Keto | C23C 16/45574 |
| 2019/0186012 A1* | 6/2019 | Tutt | C23C 16/45555 |
| 2020/0385863 A1* | 12/2020 | Soininen | C23C 16/45551 |
| 2021/0025057 A1* | 1/2021 | Soininen | C23C 16/45563 |

FOREIGN PATENT DOCUMENTS

| | | |
|---|---|---|
| WO | 2013/121102 A2 | 8/2013 |
| WO | 2014/127363 A1 | 8/2014 |
| WO | 2014/132892 A1 | 9/2014 |
| WO | 2016/005661 A1 | 1/2016 |

OTHER PUBLICATIONS

Office action and search report for related CN Patent Application No. 2016800696227, dated Jun. 28, 2019, in 3 pages.

International Search Report and Written Opinion for related PCT application No. PCT/FI2016/050874, dated Apr. 3, 2017, in 11 pages.

Extended European Search Report for related EP Patent Application No. 16874970.3, dated Sep. 20, 2019, in 9 pages.

\* cited by examiner

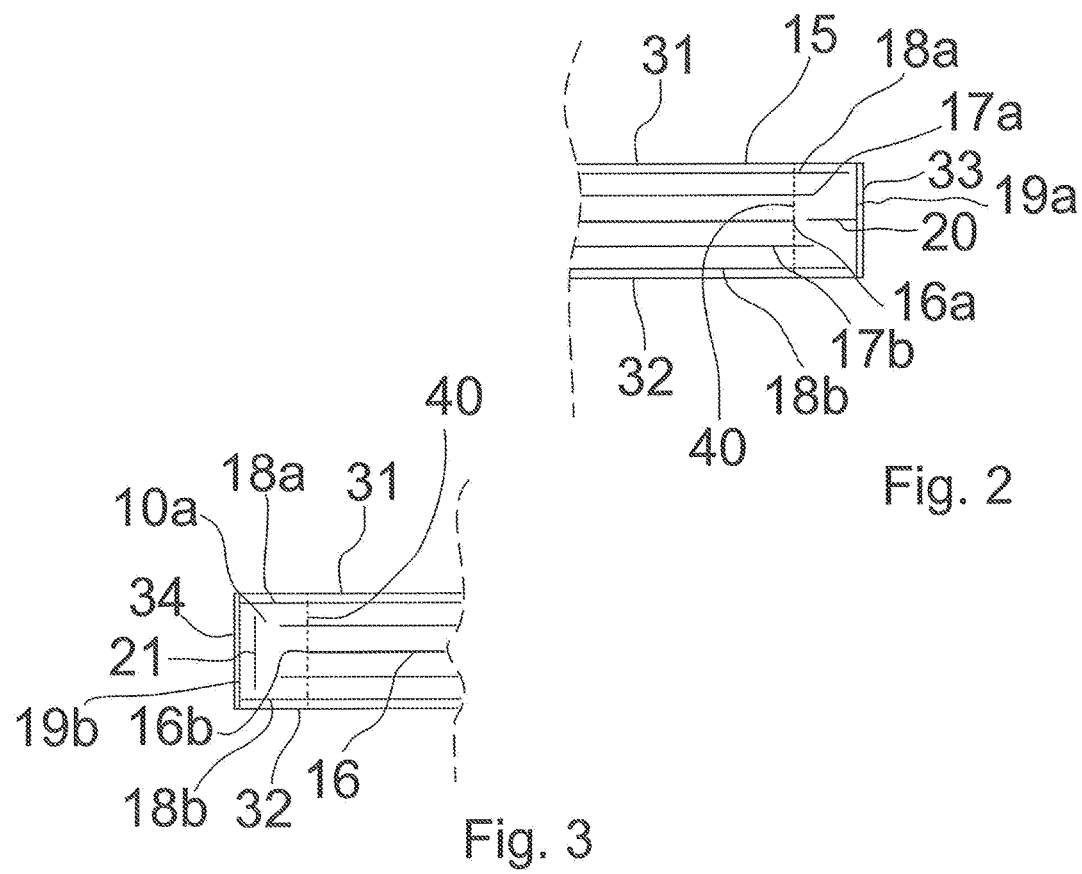
Fig. 2
Fig. 3
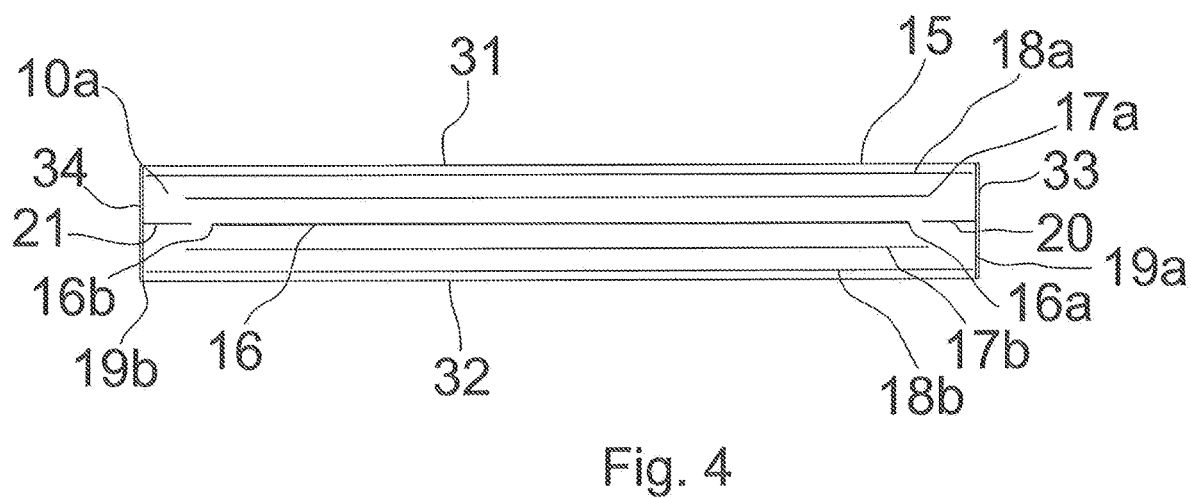
Fig. 4

COATING PRECURSOR NOZZLE AND A NOZZLE HEAD

FIELD OF THE INVENTION

The present invention relates to a coating precursor nozzle for subjecting a surface of a substrate to a coating precursor, and more particularly to a coating precursor nozzle as defined in the independent claim 1.

The present invention further relates to a nozzle head for subjecting a surface of a substrate to successive surface reactions of at least a first precursor and a second precursor, and more particularly to a nozzle head as defined in the independent claim 13.

BACKGROUND OF THE INVENTION

In the prior art several types of apparatuses, nozzle heads and nozzles are used for subjecting a surface of a substrate to successive surface reactions of at least a first precursor and a second precursor according to the principles of atomic layer deposition method (ALD). In ALD applications, typically two gaseous precursors are introduced into the ALD reactor in separate stages. The gaseous precursors effectively react with the substrate surface, resulting in deposition of a growth layer having a maximal thickness of only one monolayer (which can be an atomic layer or a molecular layer). The precursor stages are typically followed or separated by an inert-gas purge stage that eliminates the excess precursor from the surface of the substrate prior to the separate introduction of the other precursor. Therefore an ALD process requires alternating in sequence the flux of precursors to the surface of the substrate. This repeated sequence of alternating surface reactions and purge stages between is a typical AIM deposition cycle. By repeating these cycles, a very conformal and pin hole free film can be obtained, and the thickness of the film can be controlled by the number of deposition cycles. For more complex layers, more precursors e.g. a third and a fourth precursor can be used.

The prior art apparatuses for continuously operating ALD usually comprise a nozzle head having one or more first precursor nozzles for subjecting the surface of the substrate to the first precursor, one or more second precursor nozzles for subjecting the surface of the substrate to the second precursor, one or more purge gas channels and one or more discharge channels for discharging both precursors and purge gas arranged in some order. The nozzle is preferably moved in relation to the substrate for producing a number of growth layers. The feeding of the precursors in the continuous ALD (also called spatial ALD) is separated spatially.

In prior art apparatuses the nozzle head is arranged to subject the surface of the substrate to precursors such that the surface is coated with growth layers of deposited material. The nozzle head in a spatial ALD apparatus forms a growth layer that is even in a longitudinal direction of the substrate. The evenness is good also in a cross direction of the substrate. However in the edge regions of the coating layer formed of several growth layers there are usually unwanted variations in the growth layers such that the thickness of the coating layer varies. This is because the precursor and purge (inert) gas exposure at the edge regions is not always uniform due to nonideal flows of the precursors and inert purge gases.

The variation in thickness in the edge region of the substrate causes also other problems than an uneven coating layer in the edge of the substrate or in the edge of the coating. A further problem is that the precursors may escape away from the area to be coated to a surrounding area of the nozzle head contaminating it, the nozzle head itself, or gas channels and conduits, vacuum chambers and other parts of the coating tool where the nozzle operates.

This is thought to be a result from diverging flows of nitrogen in the edge region, which may cause turbulence and thereby impairing, the barrier effect of the flow. Similarly, due to the movements or other factors pressure fluctuations and turbulence occurs in the edge region of the nozzle head disturbing flows.

BRIEF DESCRIPTION OF THE INVENTION

An object of the present invention is thus to provide a coating precursor nozzle and a nozzle head so as to overcome the above problems. The objects of the invention are achieved by a coating precursor nozzle and a nozzle head which are characterized by what is stated in the independent claims. The preferred embodiments of the invention are disclosed in the dependent claims.

The idea of the invention is to provide an auxiliary purge gas to the edge region of the area to be coated such that with the help of the auxiliary purge gas the actual growth layer can be moved further from the edge region which is challenging for the flows.

According to the invention a coating precursor nozzle for subjecting a surface of a substrate to a coating precursor has a nozzle output face, first and second nozzle side edges, and first and second nozzle end edges. The coating precursor nozzle comprises a precursor supply channel having a first precursor supply channel end and a second precursor supply channel end for subjecting the surface of the substrate to the precursor via the nozzle output face, said precursor supply channel extending longitudinally between the first and second nozzle end edges; a first discharge channel open to the nozzle output face for discharging at least a fraction of the precursor supplied from the precursor supply channel, said first discharge channel extending longitudinally between the first and second nozzle end edges; a second discharge channel open to the nozzle output face for discharging at least a fraction of the precursor supplied from the precursor supply channel, said second discharge channel extending longitudinally between the first and second nozzle end edges; said precursor supply channel is arranged between the first and the second discharge channel; a first cross purge gas channel for supplying purge gas, said first cross purge gas channel extending longitudinally between the first and second nozzle end edges; a second cross purge gas channel for supplying purge gas, said second cross purge gas channel extending longitudinally between the first and second nozzle end edges; said first and said second discharge channel and said precursor supply channel are arranged between the first and the second cross purge gas channel; a first edge purge gas channel provided between the first nozzle end edge and the first precursor supply channel end, said first edge purge gas channel extending longitudinally between the first and second nozzle side edges; and at least one first auxiliary purge gas channel arranged in an area between the first and second nozzle side edges and the first edge purge gas channel and a line extending from the first nozzle side edge to the second nozzle side edge via the first precursor supply channel end.

According to the invention a nozzle head for subjecting a surface of a substrate to successive surface reactions of at least a first precursor and a second precursor has an output face, parallel first and second end edges, and parallel first and second side edges; the nozzle head comprising a plurality of coating precursor nozzles according to what is previously presented, which the nozzles are arranged adjacently to each other and extending longitudinally between the first and second side edges on the output face.

It has been surprisingly found that in the prior art solutions the precursors can traverse from the precursor supply channels towards the edge of the substrate in an uncontrollable fashion, creating random flows that subject the surface of the substrate to the precursors also randomly in the edge regions of the substrate. Subsequently, uneven and, thickness-wise, uncontrolled layer growth is created to said edge regions. Further, as the discharge of the precursors is not well controlled, precursors can also leak from the edges to the other parts of the coating tool, and thus unwanted, soiling or residue growth can result in various parts of the coating tool, increasing maintenance needs of the apparatus.

The main problem in a nozzle is that the flow is not the same in the ends of the nozzle as it is in the middle of the nozzle because of geometrical factors of the nozzle. One way to overcome the problem it is to create divergent flow to prevent the interaction of the nozzle and the surrounding area. This leads to intersecting flow channels which moreover cannot in most cases join, for example two supply channels or suction and supply. In these kinds of discontinuity areas it is difficult to prevent turbulence. Therefore the precursor supply channel is arranged to end in an ideal point in the nozzle and the extension area to the precursor supply channel is provided with purge gas. Therefore the coating has a clear end border line in the point where the precursor supply channel ends and all the turbulence caused by the geometry is in the purge supply zone in other words the area in which the auxiliary purge gas channel provides purge gas has to be so wide that the turbulence does not reach to the edge of precursor supply area.

An advantage the coating precursor nozzle and the nozzle head of the invention is that the edge region of the coating layer to be produced with the coating precursor nozzle is under control during the process and contamination does not occur in the nozzle head because of precursors leaking in the edge region.

BRIEF DESCRIPTION OF THE DRAWINGS

In the following the invention will be described in greater detail by means of preferred embodiments with reference to the attached drawings, in which

FIG. 2 shows a part of a nozzle according to the invention;

FIG. 3 shows another part of a nozzle according to the invention;

FIG. 4 shows one embodiment of a nozzle according to the invention;

DETAILED DESCRIPTION OF THE INVENTION

Figure 1:
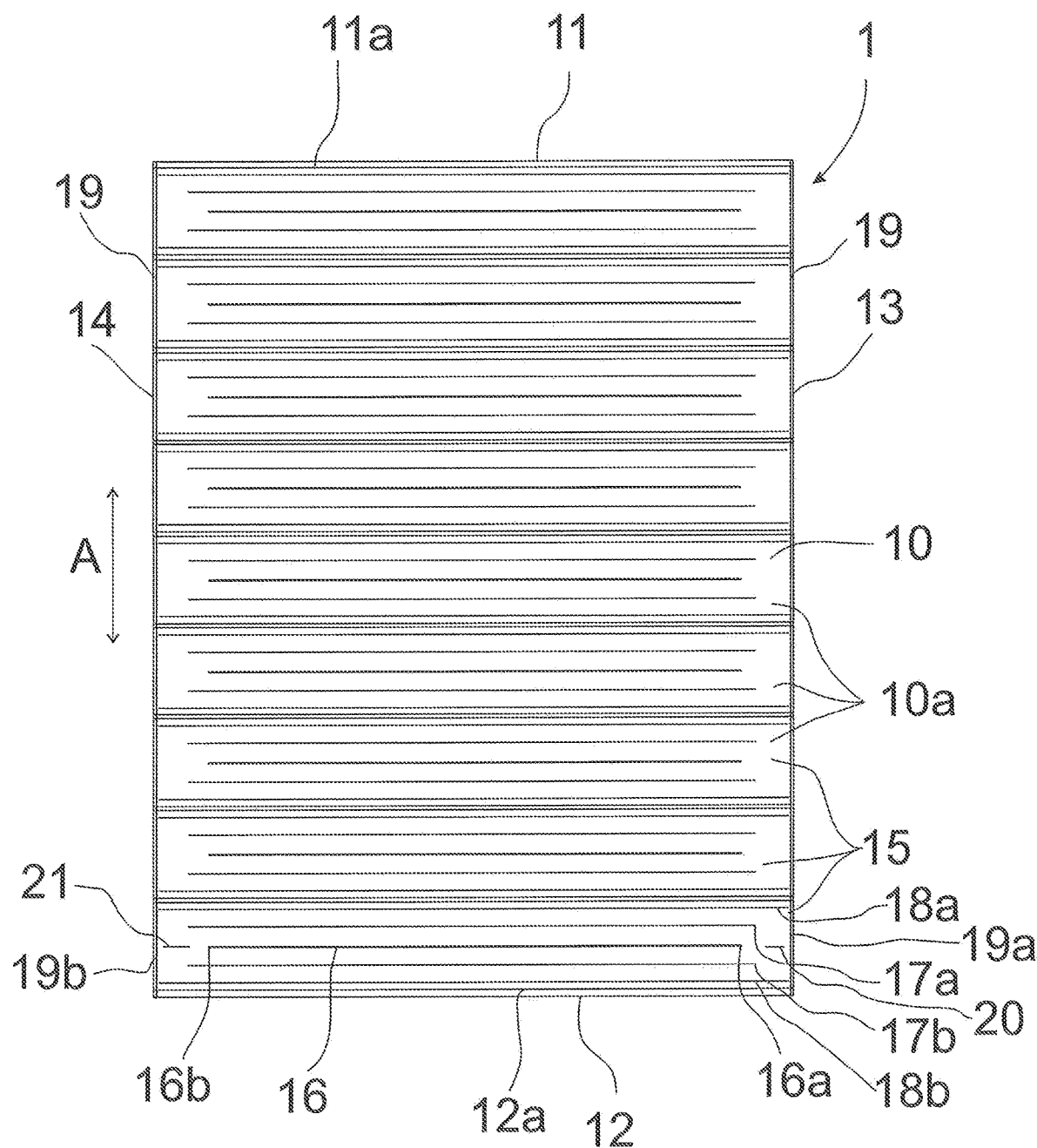
FIG. 1 shows one embodiment of a nozzle head according to the invention.

FIG. 1 shows schematically one embodiment of a nozzle head 1 according to the present invention. The nozzle head 1 comprises an output face 10 via which the gaseous precursors are supplied, said output face 10 is formed of multiple nozzle output faces 10a. The body of the nozzle head comprises parallel first and second end edges 11, 12 and parallel first and second side edges 13, 14. The nozzle head 1 comprises a plurality of coating precursor nozzles 15 which are arranged adjacently to each other and extending longitudinally between the first and second side edges 13, 14 on the output face 10. In the embodiment of FIG. 1 the nozzle head output face 10 is planar, but in an alternative embodiment it may also be non-planar, curved, cylindrical or have any other suitable form. The nozzle head 1 is provided with nozzles 15 arranged adjacently to each other and extending longitudinally along the output face 10. The adjacent nozzles 15 are separated with a gap 40 from each other. The gap 40 may not be significant but it defines the nozzles 15 edges and borders of adjacent nozzles. In the application the coating precursor nozzles may also be referred merely as the nozzles still meaning the same as the coating precursor nozzles.

The nozzles 15 comprise a precursor supply channel 16, a first discharge channel 17a and a second discharge channel 17b, which are arranged such that said precursor supply channel 16 is arranged between the first and the second discharge channel 17a, 17b. The precursor supply channel 16 and the first and second discharge channels 17a, 17b are formed as longitudinal channel. The nozzles 15 further comprise a first cross purge gas channel 18a and a second cross purge gas channel 18b for supplying purge gas. The first and second discharge channel 17a, 17b and the precursor supply channel 16 are arranged between the first and second cross purge gas channel 18a, 18b.

It should be noted that the nozzles 15 may be integral parts of the nozzle head 1 or alternatively they may be detachable parts which may be removed or replaced. The purge gas channels 18a, 18b are preferably longer than the discharge channels 17a, 17b or the precursor supply channel 16.

The discharge channels 17a, 17b are connected to vacuum pump or the like such that it may discharge precursors and purge gas from the nozzle output faces 10a. The discharge channels 17a, 17b are open to the nozzle output face 10a for discharging at least a fraction of the precursor supplied from the precursor supply channel 16 and said discharge channels 17a extend longitudinally between the first and second nozzle end edges 33, 34. The nozzle head 1 side edges 13, 14 are formed from multiple nozzle end edges 33, 34. The discharge channels 17a, 17b extending between the first and second nozzle end edges 33, 34 are separate discharge channels arranged on different sides of the precursor supply channel 16 in the nozzle 15. The precursor supply channel 16 extends longitudinally between the first and second nozzle end edges 33, 34 and comprises a first precursor supply channel end 16a and a second precursor supply channel end 16b. The purge gas channels 18a, 18b extend longitudinally between the first and second nozzle end edges 33, 34 and are arranged on different sides of the precursor supply channel 16 in the nozzle 15 such that the first discharge channel 17a is arranged between the first cross purge gas channel 18a and the precursor supply channel 16 and the second discharge channel 17b is arranged between the second cross purge gas channel 18b and the precursor supply channel 16.

The FIG. 1 also shows that a first edge purge gas channel 19a is provided between the first nozzle end edge 33 and the first precursor supply channel end 16a such that the first edge purge gas channel 19a extends longitudinally between the first and second nozzle side edges 31, 32. Preferably the first edge purge gas channel 19a is parallel to the first nozzle end edge 33. However this is not mandatory because the first nozzle end edge may be formed otherwise. The nozzle 15 further comprises at least one first auxiliary purge gas channel 20 arranged in an area between the first and second nozzle side edges 31, 32 and the first edge purge gas channel 19a and a line 40 extending from the first nozzle side edge 31 to the second nozzle side edge 32 via the first precursor supply channel end 16a. This can be seen in more detail in FIG. 2. The first and second cross purge gas channels 18a, 18b are preferably in fluid communication with the first and second edge purge gas channels 19a, 19b. The FIG. 1 also shows that the first edge purge gas channel 19a is in fluid connection with the second edge purge gas channel 19b via one or more cross purge gas channels 18a, 18b.

As can be seen from FIG. 1 nozzle head 1 comprises a continuous first nozzle head edge purge gas channel 19.1 formed from multiple first edge purge channels 19a and that the nozzle head 1 comprises a continuous second nozzle head edge purge gas channel 19.2 formed from multiple second edge purge channels 19b.

Figure also shows an arrow marked with A that illustrates the movement of the nozzle head 1 or the movement of the substrate 5 or movement of the nozzle head 1 and the substrate 5. The nozzle head 1 is moved in relation to the substrate for producing a number of growth layers or the substrate 5 is moved in relation to the nozzle head 1 or the movement between the nozzle head 1 and the substrate 5 is arranged by moving both the substrate 5 and the nozzle head 1.

The FIG. 2 shows a part of a nozzle 15 comprising first and second nozzle side edges 31, 32 and a first nozzle end edge 33. The FIG. 2 shows that the nozzle 15 comprises a precursor supply channel 16 having the first end 16a and the first edge purge gas channel 19a provided in the proximity of the first nozzle end edge 33. The FIG. 2 further shows that the first auxiliary purge gas channel 20 is arranged in the area between the first and second nozzle side edges 31, 32 and the first edge purge gas channel 19a and a line 40 extending from the first nozzle side edge 31 to the second nozzle side edge 32 via the first precursor supply channel end 16a, the line 40 is shown as a dotted line. In this embodiment shown in FIG. 2 the first auxiliary purge gas channel 20 is arranged to extend from the first edge purge gas channel 19a such that the at least one first auxiliary purge gas channel 21) is in fluid communication with the first edge purge gas channel 19a. The first auxiliary purge gas channel 20 extends from the first edge purge gas channel 19a toward the precursor supply channel 16. Although FIG. 2 shows that the precursor supply channel 16 and first the auxiliary purge gas channel 20 are in line they do not need to be. The first auxiliary purge gas channel 20 may also have branches so that there are several first auxiliary purge gas channels 20 extending toward the precursor supply channel 16 or the area defined by the first and second discharge channels 17a, 17b. As can be seen from FIG. 2 the at least one first auxiliary purge gas channel 20 is arranged at least partly between the first and second discharge channel 17a, 17b extending closer to the first nozzle end edge 33 than the precursor supply channel 16.

FIG. 3 shows a part of a nozzle 15 comprising first and second nozzle side edges 31, 32 and a second nozzle end edge 34. The FIG. 3 shows that the nozzle 15 comprises a purge gas channel 16 having the second end 16b and the second edge purge gas channel 19b provided in the proximity of the second nozzle end edge 34. The FIG. 3 further shows that the second auxiliary purge gas channel 21 is arranged in the area between the first and second nozzle side edges 31, 32 and the second edge purge gas channel 19b and a line 40 extending from the first nozzle side edge 31 to the second nozzle side edge 32 via the second precursor supply channel end 16b, the line 40 is shown as a dotted line. In the embodiment shown in FIG. 3 the auxiliary purge gas channel 20 is arranged to extend parallel to the edge purge gas channel 19b between the first and second cross purge gas channel 18a, 18b. So the nozzle 15 further comprises a second edge purge gas channel 19b provided between the second nozzle end edge 34 and the second precursor supply channel end 16b, said second edge purge gas channel 19b extending longitudinally between the first and second nozzle side edges 31, 32; and at least one second auxiliary purge gas channel 21 provided in an area between the first and second nozzle side edges 31, 32 and second edge purge gas channel 19b and a line 40 extending from the first nozzle side edge 31 to the second nozzle side edge 32 via the second precursor supply channel end 16b. As can be seen from FIG. 3 the at least one second auxiliary purge gas channel 21 is arranged to extend in the direction parallel to the second nozzle end edge 34. Similarly the at least one first auxiliary purge gas channel 20 can be arranged to extend in the direction parallel to the first nozzle end edge 33.

FIG. 4 shows a nozzle 15 comprising a precursor supply channel 16 having a first precursor supply channel end 16a and a second precursor supply channel end 16b for subjecting the surface of the substrate to the precursor via the nozzle output face 10a. The precursor supply channel 16 extends longitudinally between the first and second nozzle end edges 33, 34. A first discharge channel 17a and a second discharge channel 17b extend longitudinally between the first and second nozzle end edges 33, 34. The precursor supply channel 16 is arranged between the first and the second discharge channel 17a, 17b. A first cross purge gas channel 18a and a second cross purge gas channel 18b extend longitudinally between the first and second nozzle end edges 33, 34 and said first and said second discharge channel 17a, 17b and said precursor supply channel 16 are arranged between the first and the second cross purge gas channel 18a, 18b, in the vicinity of the nozzle end edges 33, 34 are a first edge purge gas channel 19a provided between the first nozzle end edge 33 and the first precursor supply channel end 16a and a second edge purge gas channel 19b provided between the second nozzle end edge 34 and the second precursor supply channel end 16b. Both first and second edge purge gas channels 19a, 19b extending longitudinally between the first and second nozzle side edges 31, 32. The FIG. 4 further shows that the nozzle comprises a first auxiliary purge gas channel 20 arranged in an area between the first and second nozzle side edges 31, 32 and the first edge purge gas channel 19a and a line 40 extending from the first nozzle side edge 31 to the second nozzle side edge 32 via the first precursor supply channel end 16a and a second auxiliary purge gas channel 21 provided in an area between the first and second nozzle side edges 31, 32 and second edge purge gas channel 19b and a line 40 extending from the first nozzle side edge 31 to the second nozzle side edge 32 via the second precursor supply channel end 16b. In this embodiment of the invention both the first and the second auxiliary purge gas channels 20, 21 are arranged to extend from the edge purge gas channel 19a, 19b toward the precursor supply channel 16. However this does not need to be so that the both first and second auxiliary purge gas channels 20, 21 are arranged to extend in the same direction or to be similar otherwise. So the first cross purge gas channel 18a and the second cross purge gas channel 18b are arranged to extend closer to the first nozzle end edge 33 than the precursor supply channel 16 and the at least one first auxiliary purge gas channel 20 is provided at least partly between the first cross purge gas channel 18a and the second cross purge gas channel 18b; or the first cross purge gas channel 18a and the second cross purge gas channel 18b extend closer to the second nozzle end edge 34 than the precursor supply channel 16 and the at least one second auxiliary purge gas channel 21 is provided at least partly between the first cross purge gas channel 18a and the second cross purge gas channel 18b. As can be seen from FIG. 4 the at least one second auxiliary purge gas channel 21 is arranged at least partly between the first and second discharge channel 17a, 17b extending closer to the second nozzle end edge 34 than the precursor supply channel 16 and further can be seen that the at least one first auxiliary purge gas channel 20 is arranged to extend from the first edge purge gas channel 19a such that the at least one first auxiliary purge gas channel 20 is in fluid communication with the first edge purge gas channel 19a. The FIG. 4 further shows that the at least one second auxiliary purge gas channel 21 is arranged to extend from the second edge purge gas channel 19b such that the at least one second auxiliary purge gas channel 21 is in fluid communication with the second edge purge gas channel 19b.

Figure 5:
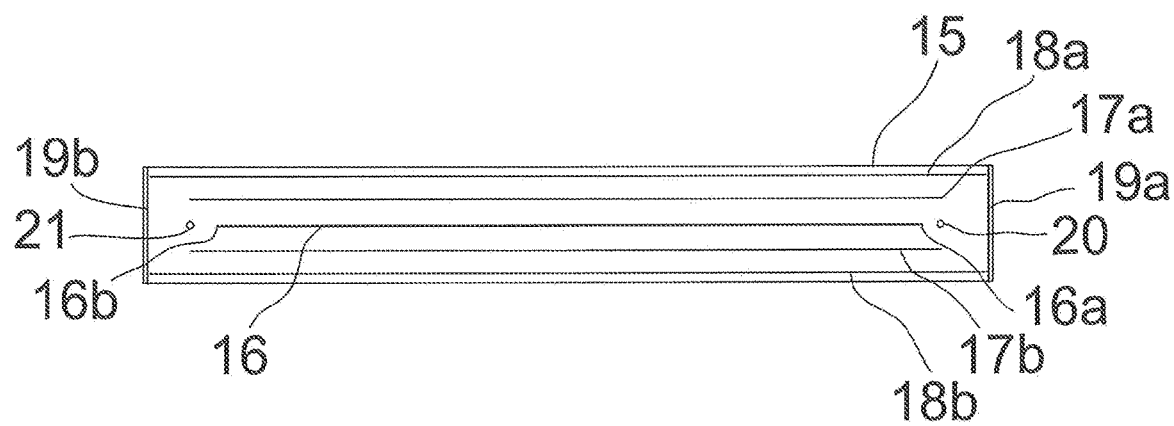
FIG. 5 shows another embodiment of a nozzle according to the invention.

FIG. 5 shows still another embodiment of a nozzle 15. In this embodiment the first and second auxiliary purge gas channels 20, 21 are in a form of a supply hole extending and opening toward the nozzle output face 10a. In this embodiment the first and second auxiliary purge gas channels 20, 21 in the form of the supply holes are arranged in the proximity of the first and second precursor supply channel ends 16a, 16b such that the supply holes are in an area between the first and the second discharge channel 17a, 17b. Although the FIG. 5 shows that there is only one supply hole in both ends of the nozzle 15 the invention does not limit to that but there can be several supply holes in the end part of the nozzle 15. So the at least one first auxiliary purge gas channel 20 or the at least one second auxiliary purge gas channel 21 is arranged as a separate point source in the nozzle output face 10a.

As seen in FIG. 1 the nozzle head 1 is formed from multiple nozzles 15. As the nozzle comprises an edge purge gas channel 19a, 19b in both ends of the nozzle 15 the adjacent nozzles also form a continuous edge purge gas channel 19 in the nozzle head 1. The nozzle head 1 may also comprise edge purge gas channels in the first and second end edges 11, 12 so that the end edge purge gas channels 11a, 12a form together with the multiple first edge purge gas channels 19a and multiple second edge purge gas channels 19b a continuous edge purge gas channel that circumvents the edge region of the nozzle head 1.

The first and second auxiliary purge gas channels 20, 21 may extend from the edge purge gas channels 19a, 19b along the nozzle output face 10a or they may extend from the edge purge gas channels 19a, 19b such that they extend inside the nozzle structure and only open as a supply hole to the nozzle output face 10a. In another embodiment of the invention the first or second auxiliary purge gas channel 20, 21 may be separately arranged from the edge purge gas channel 19a, 19b as a separate auxiliary purge gas channel. The at least one first auxiliary purge gas channel 20 is arranged to extend in the direction of the first edge purge gas channel 19a or the at least one second auxiliary purge gas channel 21 is arranged to extend in the direction of the second edge purge gas channel 19b. The at least one first auxiliary purge gas channel 20 or the at least one second auxiliary purge gas channel 21 is arranged to extend in the direction of the precursor supply channel 16.

Figure 6:
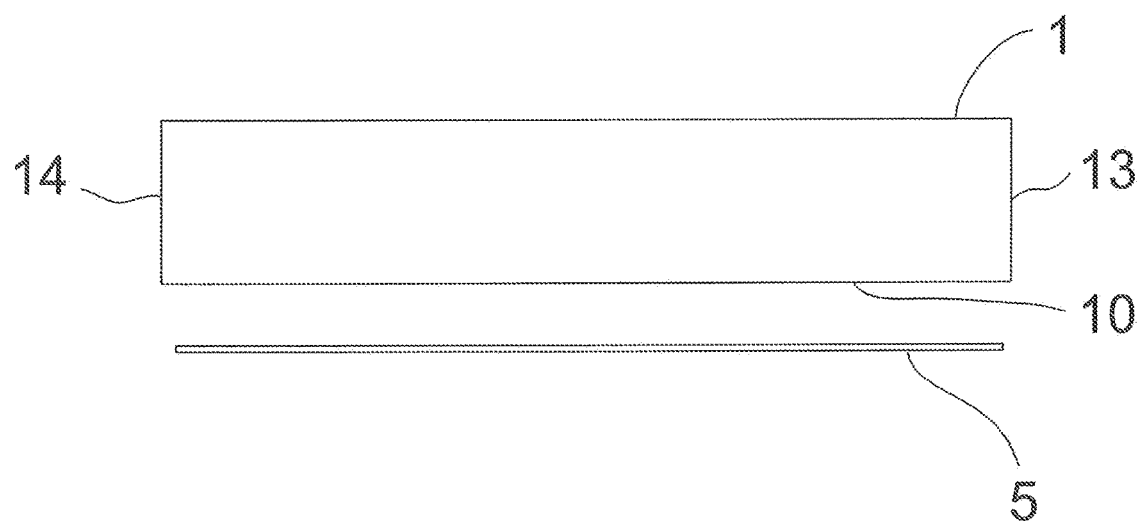
FIG. 6 shows schematically a nozzle head according to the invention.

The FIGS. 1-5 show the nozzles as seen from the surface of the substrate but FIG. 6 shows is as seen from the end of the nozzle head 1 such that parallel first and second side edges 13, 14 and the output face 10 are shown and the substrate 5 faces the output face 10.

FIGS. 1, 3 and 5 show that the at least one first auxiliary purge gas channel 20 or the at least one second auxiliary purge gas channel 21 is arranged as a separate channel in the nozzle output face 10a.

Although not shown in the figures in one embodiment of the invention the second cross purge gas channel 18b of a coating precursor nozzle 15 is arranged to form the first cross purge gas channel 18a of an adjacent coating precursor nozzle 15. In other words, adjacent coating precursor nozzles have a common purge gas channel which is a first cross purge gas channel of a first coating precursor nozzle and a second cross purge gas channel of the adjacent precursor nozzle for the first coating precursor nozzle. In another embodiment for each of the coating precursor nozzles 15 except the last coating precursor nozzle, the second cross purge gas channel 18b of a coating precursor nozzle 15 is the first cross purge gas channel 18a of the adjacent coating precursor nozzle.

It will be obvious to a person skilled in the art that, as the technology advances, the inventive concept can be implemented in various ways. The invention and its embodiments are not limited to the examples described above but may vary within the scope of the claims.

The invention claimed is:

1. A coating precursor nozzle for subjecting a surface of a substrate to a coating precursor, the coating precursor nozzle having a nozzle output face, first and second nozzle side edges, and first and second nozzle end edges; the coating precursor nozzle comprising:
   a precursor supply channel having a first precursor supply channel end and a second precursor supply channel end for subjecting the surface of the substrate to the precursor via the nozzle output face, said precursor supply channel extending longitudinally between the first and second nozzle end edges;
   a first discharge channel open to the nozzle output face for discharging at least a fraction of the precursor supplied from the precursor supply channel, said first discharge channel extending longitudinally between the first and second nozzle end edges;
   a second discharge channel open to the nozzle output face for discharging at least a fraction of the precursor supplied from the precursor supply channel, said second discharge channel extending longitudinally between the first and second nozzle end edges;
   said precursor supply channel is arranged between the first and the second discharge channel;
   a first cross purge gas channel for supplying purge gas, said first cross purge gas channel extending longitudinally between the first and second nozzle end edges;
   a second cross purge gas channel for supplying purge gas, said second cross purge gas channel extending longitudinally between the first and second nozzle end edges;
   said first and said second discharge channel and said precursor supply channel are arranged between the first and the second cross purge gas channel;
   a first edge purge gas channel for supplying purge gas provided between the first nozzle end edge and the first precursor supply channel end, said first edge purge gas channel extending longitudinally between the first and second nozzle side edges; characterized in that the coating precursor nozzle further comprises at least one first auxiliary purge gas channel for supplying purge gas arranged in an area between the first and second nozzle side edges and the first edge purge gas channel and a line extending from the first nozzle side edge to the second nozzle side edge via the first precursor supply channel end.

2. A coating precursor nozzle according to claim 1, characterized in that the nozzle further comprises a second edge purge gas channel provided between the second nozzle end edge and the second precursor supply channel end, said second edge purge gas channel extending longitudinally between the first and second nozzle side edges; and at least one second auxiliary purge gas channel provided in an area between the first and second nozzle side edges and second edge purge gas channel and a line extending from the first nozzle side edge to the second nozzle side edge via the second precursor supply channel end.

3. A coating precursor nozzle according to claim 2, characterized in that the at least one second auxiliary purge gas channel is arranged to extend from the second edge purge gas channel such that the at least one second auxiliary purge gas channel is in fluid communication with the second edge purge gas channel.

4. A coating precursor nozzle according to claim 2, characterized in that the first edge purge gas channel is in fluid connection with the second edge purge gas channel via one or more cross purge gas channels.

5. A coating precursor nozzle according to claim 1, characterized in that the first cross purge gas channel and the second cross purge gas channel are arranged to extend closer to the first nozzle end edge than the precursor supply channel and the at least one first auxiliary purge gas channel is provided at least partly between the first cross purge gas channel and the second cross purge gas channel; or the first cross purge gas channel and the second cross purge gas channel extend closer to the second nozzle end edge than the precursor supply channel and an at least one second auxiliary purge gas channel is provided at least partly between the first cross purge gas channel and the second cross purge gas channel.

6. A coating precursor nozzle according to claim 1, characterized in that the at least one first auxiliary purge gas channel is arranged at least partly between the first and second discharge channel extending closer to the first nozzle end edge than the precursor supply channel.

7. A coating precursor nozzle according to claim 1, characterized in that the at least one first auxiliary purge gas channel or an at least one second auxiliary purge gas channel is arranged to extend in the direction of the precursor supply channel.

8. A coating precursor nozzle according to claim 1, characterized in that the at least one first auxiliary purge gas channel is arranged to extend from the first edge purge gas channel such that the at least one first auxiliary purge gas channel is in fluid communication with the first edge purge gas channel.

9. A coating precursor nozzle according to claim 1, characterized in that the at least one first auxiliary purge gas channel or an at least one second auxiliary purge gas channel is arranged as a separate point source in the nozzle output face.

10. A coating precursor nozzle according to claim 1, characterized in that the at least one first auxiliary purge gas channel or an at least one second auxiliary purge gas channel is arranged as a separate channel in the nozzle output face.

11. A coating precursor nozzle according to claim 1, characterized in that the at least one first auxiliary purge gas channel is arranged to extend in the direction of the first edge purge gas channel.

12. A coating precursor nozzle according to claim 1, characterized in that the at least one first auxiliary purge gas channel is arranged to extend in the direction parallel to the first nozzle end edge.

13. A coating precursor nozzle according to claim 1, characterized in that an at least one second auxiliary purge gas channel is arranged at least partly between the first and second discharge channel extending closer to the second nozzle end edge than the precursor supply channel.

14. A coating precursor nozzle according to claim 1, characterized in that an at least one second auxiliary purge gas channel is arranged to extend in the direction of the second edge purge gas channel.

15. A coating precursor nozzle according to claim 1, characterized in that an at least one second auxiliary purge gas channel is arranged to extend in the direction parallel to the second nozzle end edge.

16. A coating precursor nozzle according to claim 1, wherein:

the at least one first auxiliary purge gas channel defines a long axis that is aligned with a long axis defined by the precursor supply channel; and/or the at least one first auxiliary purge gas channel is parallel with the precursor supply channel and disposed between the first precursor supply channel end and the first nozzle end edge.

17. A nozzle head for subjecting a surface of a substrate to successive surface reactions of at least a first precursor and a second precursor, the nozzle head having an output face, parallel first and second end edges, and parallel first and second side edges; the nozzle head comprising a plurality of coating precursor nozzles according to claim 1, the nozzles are arranged adjacently to each other and extending longitudinally between the first and second side edges on the output face.

18. A nozzle head according to claim 17, characterized in that the nozzle head comprises a continuous first nozzle head edge purge gas channel formed from multiple first edge purge channels.

19. A nozzle head according to claim 17, characterized in that the nozzle head comprises a continuous second nozzle head edge purge gas channel formed from multiple second edge purge channels.

20. A nozzle head according to claim 17, characterized in that the second cross purge gas channel of a coating precursor nozzle is arranged to form the first cross purge gas channel of an adjacent coating precursor nozzle.

* * * * *